(12) United States Patent
Tachikawa et al.

(10) Patent No.: US 6,376,808 B2
(45) Date of Patent: Apr. 23, 2002

(54) HEATING APPARATUS

(75) Inventors: Toshihiro Tachikawa, Yokohama; Toshihiko Hanamachi, Kawasaki, both of (JP)

(73) Assignee: NHK Spring Co., Ltd., Yokohama (JP)

( * ) Notice: Subject to any disclaimer, the term of this patent is extended or adjusted under 35 U.S.C. 154(b) by 0 days.

(21) Appl. No.: 09/847,844

(22) Filed: May 1, 2001

(30) Foreign Application Priority Data

May 12, 2000 (JP) .......................................... 12-140272

(51) Int. Cl.[7] .............................. H05B 3/68; H05B 3/08; C23C 16/00
(52) U.S. Cl. ...................... 219/444.1; 118/725; 219/541
(58) Field of Search .......................... 219/443.1, 444.1, 219/458.1, 459.1, 541; 118/724, 725, 727, 728; 439/729, 730, 865, 866, 867, 868

(56) References Cited

U.S. PATENT DOCUMENTS

| 2,740,101 A | * | 3/1956 | Betts .......................... 439/730 |
| 2,806,215 A | * | 9/1957 | Redslob ...................... 439/868 |
| 5,025,133 A | * | 6/1991 | Tsutahara et al. ........ 219/444.1 |
| 5,105,066 A | * | 4/1992 | Houdy ..................... 219/458.1 |
| 5,280,156 A | * | 1/1994 | Niori et al. ................. 118/725 |
| 5,306,895 A | * | 4/1994 | Ushikoshi et al. .......... 118/725 |
| 5,753,891 A | * | 5/1998 | Iwata et al. ................ 219/536 |
| 5,886,863 A | * | 3/1999 | Nagasaki et al. ........... 361/234 |
| 6,133,557 A | * | 10/2000 | Kawanabe et al. ......... 219/544 |
| 6,242,719 B1 | * | 6/2001 | Kano et al. .............. 219/444.1 |

FOREIGN PATENT DOCUMENTS

| JP | 6-28258 | 4/1994 |
| JP | 2525974 | 5/1996 |

* cited by examiner

*Primary Examiner*—Sang Paik
(74) *Attorney, Agent, or Firm*—Frishauf, Holtz, Goodman, Langer & Chick, P.C.

(57) ABSTRACT

A heater plate and a support structure are provided in a chamber. First terminals are arranged on the reverse side of the heater plate. The support structure is provided with second terminals in positions opposite to the first terminals, individually. The first and second terminals are coupled mechanically and electrically to one another by means of springy joint members of an electrically-conductive material. The joint members are removably attached to the first and second terminals. The heater plate can be separated from the support structure by disengaging the joint members from the first or second terminals.

7 Claims, 4 Drawing Sheets

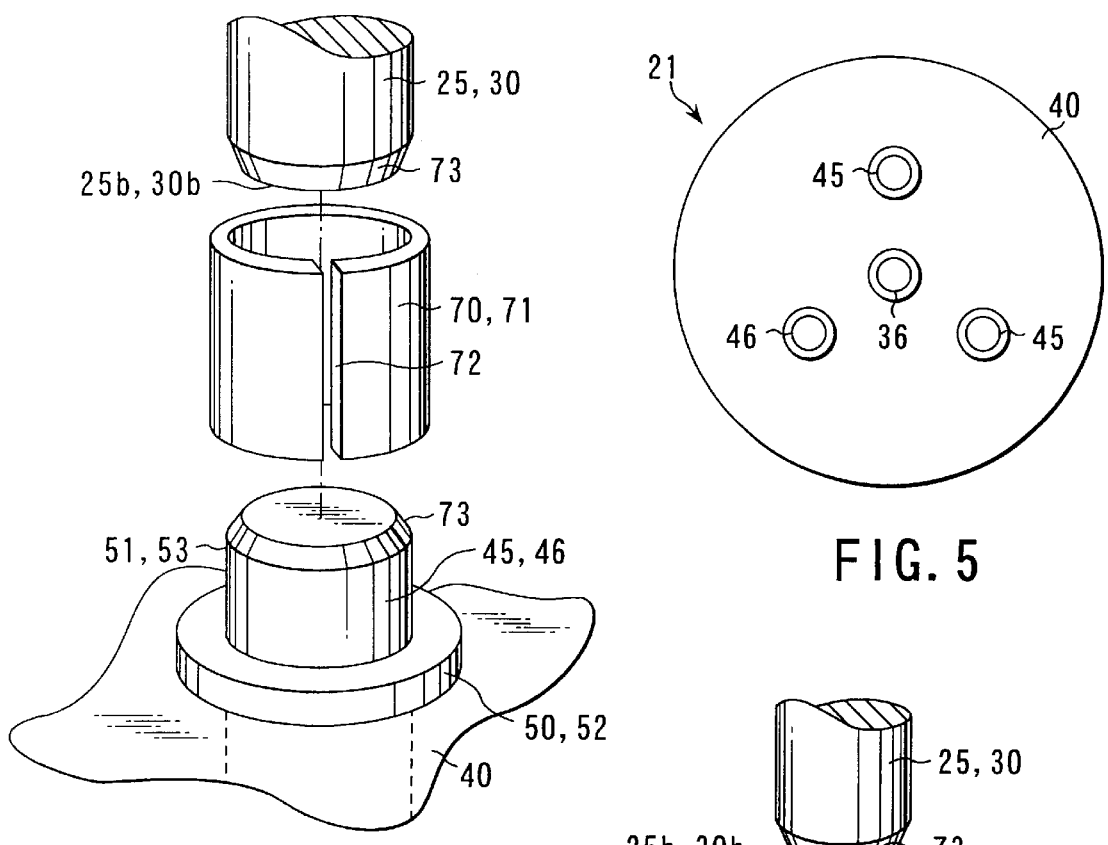
FIG. 4
FIG. 5
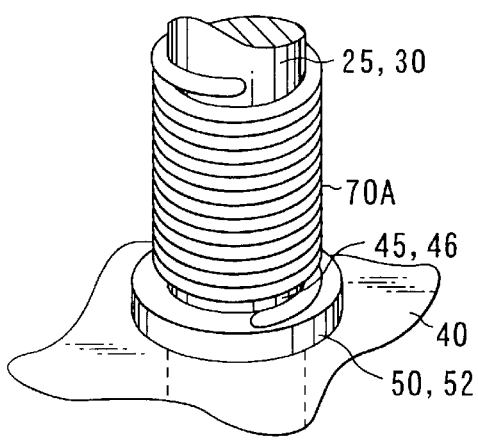
FIG. 6
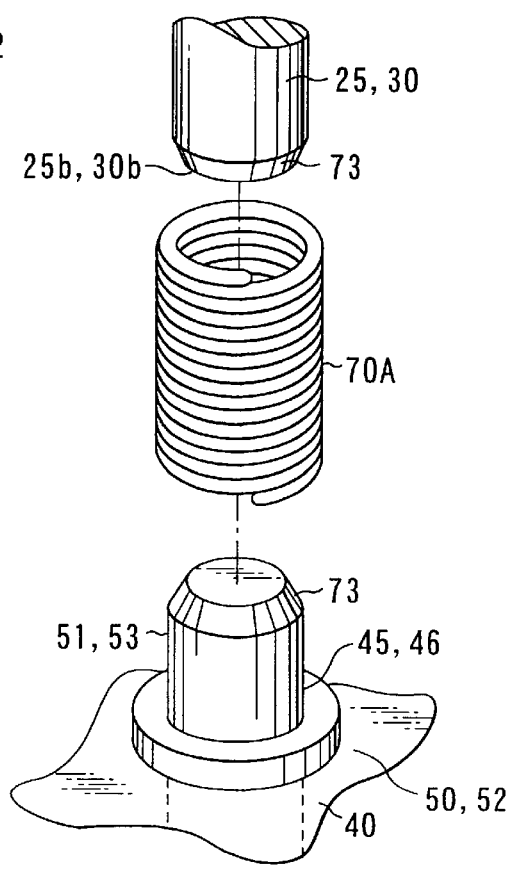
FIG. 7

HEATING APPARATUS

CROSS-REFERENCE TO RELATED APPLICATIONS

This application is based upon and claims the benefit of priority from the prior Japanese Patent Application No. 2000-140272, filed May 12, 2000, the entire contents of which are incorporated herein by reference.

BACKGROUND OF THE INVENTION

The present invention relates to a heating apparatus used to heat a workpiece such as a wafer in a semiconductor manufacturing process, for example.

In a semiconductor manufacturing process, heating apparatuses for heating wafers, semiconductor materials, are used to subject the wafers to CVD (chemical vapor deposition), PVD (physical vapor deposition), or etching. Some of these known heating apparatuses not only heat the wafers but also function as electrostatic chucks.

For example, a heating apparatus for semiconductor manufacturing process described in Jpn. Pat. Appln. KOKOKU Publication No. 6-28258 or Jpn. Pat. No. 2525974 comprises a heater plate that has a resistance heating element embedded therein and is located in a chamber that is insulated from the outside air. The heater plate is supported in a given position in the chamber by means of a hollow (tubular) support member. If necessary, the heater plate may be provided with a thermocouple for temperature control or an electrode for an electrostatic chuck.

The resistance heating element embedded in the heater plate is connected to a lead wire. The lead wire is taken out from the back surface of the heater plate toward the support member, and is connected to a power supply outside the chamber through the interior of the support member. Electric wires for the thermocouple and the electrode for electrostatic chuck are also taken out from the back surface of the heater plate and drawn out of the chamber through the support member. Thus, according to this conventional arrangement, the hollow tubular support member is bonded directly to the back surface of the heater plate, and a joint between the two members is sealed to keep the interior of the chamber airtight. Accordingly, a part of the back surface of the heater plate is allowed to touch the atmosphere through the internal space of the support member.

In the case of the conventional heating apparatus described above, a part of the back surface of the heater plate touches the atmosphere through the internal space of the support member, so that some of heat from the heater plate is inevitably radiated to the atmosphere side through the internal space of the support member. Accordingly, the temperature of that part of the heater plate which touches the atmosphere locally lowers, so that the heater plate is subject to unevenness in temperature. Since the heater plate that is used to heat wafers in the semiconductor manufacturing process requires uniform temperature distribution, in particular, unevenness in temperature is a serious problem. If the heater plate is subject to unevenness in temperature, moreover, it is affected by a greater thermal stress than in the case where the temperature distribution is uniform, so that it may be deformed or broken.

One end of the support member is connected to the heater plate, while the other end is fixed to the wall of the chamber. Therefore, the one end of the support member that receives the heat from the heater plate is kept at a high temperature, and the other end at low temperature. If this temperature gradient is sharp, a great thermal stress is generated in the support member and the like, so that the support member itself or its mounting portion on the chamber wall may possibly break. Further, a current must be supplied to compensate for the quantity of heat that escapes through the back surface of the heater plate, and the power consumption increases correspondingly.

Conventionally, the heater plate and the support member are integral with each other. If the heater specifications change as the semiconductor manufacturing process is changed, for example, therefore, the whole heating apparatus including the support member as well as the heater plate must be replaced. If the heater plate requires replacement on account of disconnection or corrosion, moreover, not only the heater plate but also the whole heating apparatus must be replaced, which is uneconomical and time consuming.

BRIEF SUMMARY OF THE INVENTION

Accordingly, the object of the present invention is to provide a heating apparatus designed so that a heater plate is less liable to unevenness in temperature, the temperature gradient of a support structure is lessened, and the heater plate can be easily replaced with a new one.

In order to achieve the above object, a heating apparatus according to the present invention comprises a heater plate having a surface for supporting a to-be-heated object and including a resistance heating element, first terminals protruding on the reverse side of the heater plate and connected electrically to the resistance heating element, a support structure for supporting the heater plate in a given position in a chamber, second terminals attached to the support structure, individually corresponding in position to the first terminals, and connected to an electric power supply for supplying electric power to the resistance heating element, and a joint member of an electrically-conductive material fitted on the first and second terminals, thereby connecting the first and second terminals electrically and mechanically to one another, and removably attached to at least one of the terminals.

Thus, according to the present invention, the heater plate and the support structure are separate components, and the terminals provided individually on these components are removably coupled to one another by means of the springy electrically-conductive joint member. By doing this, the heater plate and the support structure can be separated from each other. According to this invention, only the heater plate can be replaced with ease. Therefore, the maintenance costs and other costs of the heating apparatus can be reduced. Since the heater plate is supported indirectly on the support structure by means of the joint member, moreover, heat from the heater plate can be prevented from escaping through the support structure.

Accordingly, unevenness in the temperature of the heater plate is lessened, and the extra power consumed due to escaping heat can be reduced. Further, the quantity of heat the support structure receives from the heater plate is also reduced. Thus, the temperature gradient between that portion of the support structure which is situated near the heater plate and that portion which is fixed to the chamber can be eased, so that breakage of the support structure that is attributable to generation of thermal stress can be avoided.

Preferably, the support structure includes a top plate formed of an electrically-insulating, heat-resistant material (e.g., ceramic material) and having a diameter smaller than that of the heater plate and a stem provided on the reverse side of the top plate. The second terminals protrude from an end face of the top plate toward the heater plate. A thermal insulating space is defined between the end face of the top plate and the heater plate. According to this invention, materials can be used according to the respective functions of the heater plate and the support structure. In this case, the quantity of heat transmitted from the heater plate to the support structure side can be reduced further.

Preferably, in the present invention, the joint member is formed of a springy material and is removably fitted on the first or second terminals by utilizing its springiness. According to this invention, the joint member can be easily attached to and detached from the terminals utilizing its springiness.

In the present invention, the joint member may be a cylindrical spring having a slit, for example. The inside diameter of the cylindrical spring is smaller than the outside diameter of the first or second terminals so that the first or second terminals can be inserted into the cylindrical spring. According to this invention, the joint member is formed of the cylindrical spring that can be easily attached to and detached from the terminals.

In the present invention, the joint member may be a coil spring. The inside diameter of the cylindrical spring is smaller than the outside diameter of the first or second terminals so that the first or second terminals can be inserted into the cylindrical spring. According to this invention, the joint member is formed of the coil spring that can be easily attached to and detached from the terminals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a partial exploded perspective view showing the joint member and the terminals shown in FIG. 3;

FIG. 5 is a plan view of a support structure of the heating apparatus shown in FIG. 1;

FIG. 6 is a partial perspective view showing a joint member and terminals according to a second embodiment of the invention;

FIG. 7 is a partial exploded perspective view showing the joint member and the terminals shown in FIG. 6;

DETAILED DESCRIPTION OF THE INVENTION

Figure 1:
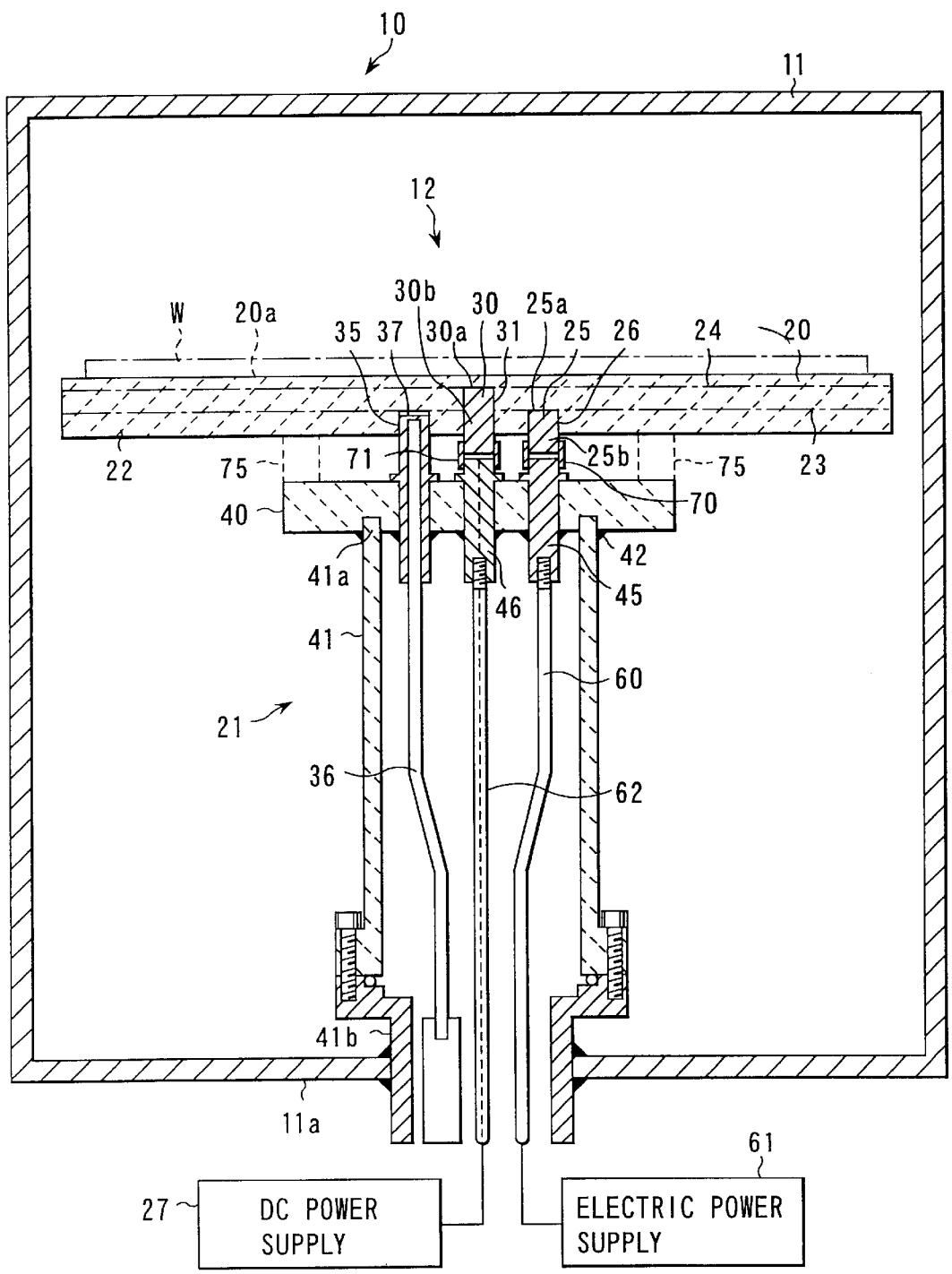
FIG. 1 is a vertical sectional view showing a heating apparatus according to a first embodiment of the present invention.
Figure 2:
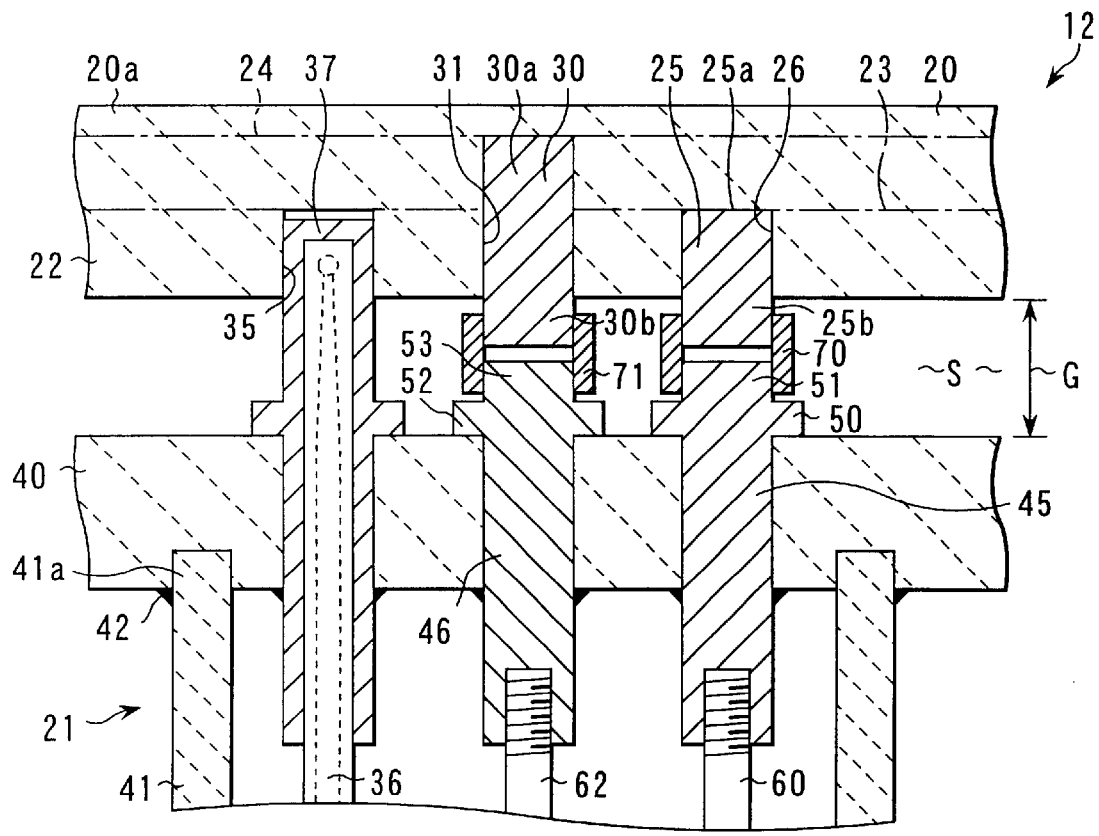
FIG. 2 is an enlarged sectional view showing a part of the heating apparatus shown in FIG. 1.

A first embodiment of the present invention will now be described with reference to the accompanying drawings of FIGS. 1 to 5. A heating apparatus 10 shown in FIG. 1 comprises a process chamber 11. A heating unit 12 is provided in the chamber 11. The heating unit 12 includes a heater plate 20 having a surface 20a that supports an object to be heated and a support structure 21 for supporting the heater plate 20 in a given position in the chamber 11. The heater plate 20 is formed in the shape of, for example, a disc, corresponding to the shape of a wafer W as an example of the to-be-heated object.

In a semiconductor manufacturing process, for example, the heater plate 20 doubles as an electrostatic chuck for holding the wafer W in the given position and means for heating the wafer W. More specifically, the heater plate 20 includes a heater body 22, a resistance heating element 23, and an electrode 24 for an electrostatic chuck. The heater body 22 is formed of a ceramic sintered member of, for example, aluminum nitride, magnesia, or alumina, or any other heat-resistant material.

The resistance heating element 23 is embedded in the heater body 22. The electrode 24 for an electrostatic chuck is also embedded in the heater body 22. A positive or negative electrostatic potential from a DC power supply 27 is applied to the electrode 24. This electrostatic potential generates electrostatic force on the surface 20a of the heater plate 20, and charged polarization is caused in minute irregularities of the surface 20a. Thus, a sucking force based on the Johnsen-Rahbek effect, along with sucking force based on Coulomb force, is generated on the surface 20a of the heater plate 20. The heater plate 20, which serves also as the electrostatic chuck, can adsorb the wafer W due to the combined results of the Johnsen-Rahbek effect and the Coulomb force.

The resistance heating element 23 and the electrode 24 for the electrostatic chuck are formed of a heat-resistant metal such as tungsten or molybdenum. A pair of current supply terminals 25 (only one of which is shown) for use as first terminals according to the present invention are connected to the heating element 23. These current supply terminals 25 are columnar metallic components. One end portion 25a of each terminal 25 is embedded in the central portion of the heater body 22 with respect to its thickness direction, while the other end portion 25b projects downward from the back surface of the heater body 22. These current supply terminals 25 are inserted individually in mounting holes 26 that are previously formed in the heater body 22, and are fixed to the body 22 by brazing or any other suitable fixing means.

An electrode terminal 30 for use as a first terminal according to the present invention is connected to the electrode 24 for an electrostatic chuck. The terminal 30 is also a columnar metallic component. One end portion 30a of the terminal 30 is embedded in the central portion of the heater body 22 with respect to its thickness direction, while the other end portion 30b projects downward from the back surface of the heater body 22. The electrode terminal 30 is inserted in a mounting hole 31 that is previously formed in the heater body 22, and is fixed to the body 22 by brazing or any other suitable fixing means. The terminal 30 is electrically insulated from the resistance heating element 23 and serves also as a radio-frequency ground.

A thermocouple hole 35 is formed in the heater plate 20. It opens on the reverse side of the heater plate 20. The upper end of the hole 35 is situated near the resistance heating element 23. A sensing portion 37 of a thermocouple 36 is inserted in the hole 35 on the reverse side of the heater plate 20. The heating temperature of the heater plate 20 can be measured by means of the thermocouple 36.

The support structure 21 consists mainly of a top plate 40, having the shape of, for example, a disc, and a hollow cylindrical stem 41 fixed to the reverse (lower surface) side of the top plate 40. One end 41a of the stem 41 is attached to the top plate 40. A member 41b that constitutes the lower part of the stem 41 is formed of a metal, for example, and is fixed airtight to a wall (e.g., bottom wall 11a) of the metallic chamber 11 that is also formed of a metal. Although the stem 41 and the member 41b shown in FIG. 1 are formed independently of each other, they may alternatively be integral with each other.

The diameter of the top plate 40 is greater than that of the stem 41. The quantity of heat transmitted from the heater plate 20 to the support structure 21 is minimized by making the diameter of the stem 41 smaller than that of the heater plate 20. By doing this, the gradient of temperature distribution from the one end 41a of the support structure 21 to the other end member 41b can be lessened.

The top plate 40 and the stem 41 are formed independently of each other from a heat-resistant material, e.g., a ceramic material similar to that of the heater body 22. The support structure 21 is constructed by fixing the top plate 40 and the stem 41 to each other. A joint 42 between the top plate 40 and the stem 41 is hermetically sealed by brazing. The top plate 40 and the stem 41 may be formed of a ceramic and a metal, respectively. Alternatively, the top plate 40 and the stem 41 may be formed integrally with each other from a heat-resistant material such as a ceramic.

Second terminals 45 and 46 according to the present invention are provided on an end face (e.g., upper surface) of the top plate 40. The terminals 45 are located in positions corresponding individually to the current supply terminals 25 of the heater plate 20. As shown in the enlarged view of FIG. 2, each of the terminals 45 is in the form of a column that has a collar portion 50. That portion of each terminal 45 which is situated above the collar portion 50 projects from the upper surface of the top plate 40. The other terminal 46 is located in a position corresponding to the electrode terminal 30. The terminal 46 is also in the form of a column that has a collar portion 52. That portion of the terminal 46 which is situated above the collar portion 52 projects from the upper surface of the top plate 40. The respective outside diameters of upper end portions 51 and 53 of the terminals 45 and 46 are substantially the same as that those of the terminals 25 and 30 of the heater plate 20.

As shown in FIG. 1, a current supply lead wire 60 is connected to each terminal 45. Each lead wire 60 is guided to the outside of the chamber 11 through the interior of the hollow stem 41, and connected to an electric power supply 61. A ground wire 62 is connected to the terminal 46. The ground wire 62 is also guided to the outside of the chamber 11 through the interior of the stem 41. The thermocouple 36 is also guided to the outside of the chamber 11 through the interior of the stem 41.

The sensing portion 37 of the thermocouple 36 and the terminals 45 and 46 are fixed airtight to the top plate 40 by brazing or other bonding means. By this airtight bonding, the interior of the chamber 11 is isolated from the internal space of the stem 41 or an atmosphere-side space. The sensing portion 37 of the thermocouple 36 is inserted in the thermocouple hole 35 in the back surface of the heater plate 20.

As shown in FIG. 5, the three or more terminals 45 and 46 are arranged at pitches in the circumferential direction of the top plate 40, so that the heater plate 20 can be supported horizontally on the plate 40. The heater plate 20 is supported substantially parallel to the top plate 40 in a manner such that the former is situated above the latter at a distance G (shown in FIG. 2) therefrom. A thermal insulating space S corresponding to the distance G is defined between the plates 20 and 40.

Figure 3:
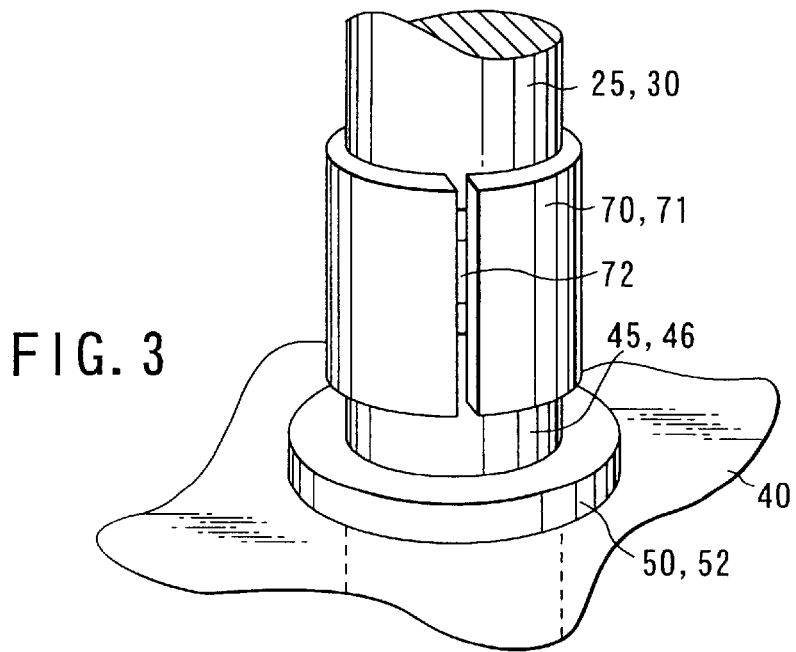
FIG. 3 is a partial perspective view showing a joint member and terminals used in the heating apparatus shown in FIG. 1.

The first terminals 25 and 30 and the second terminals 45 and 46 are coupled electrically and mechanically to one another by means of joint members 70 and 71. As shown in FIGS. 3 and 4, each of the joint members 70 and 71 is a hollow cylindrical spring that is formed by shaping a springy metal plate. A slit 72 is formed in the axial direction of each joint member 70 or 71. The inside diameter of each joint member 70 or 71, that is, inside diameter in a free-state that is not affected by any force, is smaller than the outside diameter of its mating terminals 25 and 45 (or terminals 30 and 46).

When the one joint member 70 is fitted on the first and second terminals 25 and 45, it deforms in a direction such that its slit 72 spreads. Under a resiliency force based on the deformation, the first and second terminals 25 and 45 are coupled to each other by means of the joint member 70, and electrical conduction is allowed between the terminals 25 and 45. When the other joint member 71 is fitted on the first and second terminals 30 and 46, it deforms in a direction such that its slit 72 spreads. Under a resiliency force based on the deformation, the first and second terminals 30 and 46 are coupled to each other by means of the joint member 71, and electrical conduction is allowed between the terminals 30 and 46. A tapered chamfer portion 73 is formed on the distal end portion of each of the terminals 25, 30, 45 and 46 so that the terminal can be easily inserted into the joint member 70 or 71.

As described above, the heater plate 20 can be held in the given position in the chamber 11 in a manner such that it is fixed to the support structure 21 by means of the joint members 70 and 71. If the heater plate 20 is expected to be disengaged from the support structure 21, the first terminals 25 and 30 or the second terminals 45 and 46 are drawn out of the joint members 70 and 71, respectively. By doing this, the heater plate 20 can be separated from the support structure 21.

Possibly, the chamber 11 may be filled up with a corrosive gas such as fluorine gas. In order to prevent the exposed portions of the terminals 25, 30, 45 and 46 and the joint members 70 and 71 from corroding, in this case, they should be subjected to corrosion-resistant surface treatment such as nickel plating.

If it is hard to maintain the parallelism between the heater plate 20 and the top plate 40 with use of the terminals 45 and 46 and the joint members 70 and 71 only, a projection 75 may be provided as indicated by the dotted line in FIG. 1. The projection 75 projects from the outer peripheral surface of the top plate 40 toward the heater plate 20. The parallelism between the heater plate 20 and the top plate 40 can be maintained by bringing the back surface of the plate 20 into contact with the projection 75. The projection 75, which is expected only to be able to support the heater plate 20 in a given posture, may be in any suitable shape, e.g., in the shape of a circular or square wall. Alternatively, a plurality of projections 75 may be arranged at pitches in the circumferential direction of the heater plate 20.

The following is a description of the operation of the heating apparatus 10 according to the first embodiment.

The resistance heating element 23 generates heat as it is supplied with current from the electric power supply 61. The current is supplied to the heating element 23 through the second terminals 45, joint member 70, first terminals 25, etc. The temperature of the heater plate 20 is detected by means of the sensing portion 37 of the thermocouple 36, and is fed back to a current control circuit of the electric power supply 61. The electrode 24 for an electrostatic chuck is supplied with a positive or negative electrostatic voltage from the DC power supply 27 through the second terminal 46, joint member 71, and first terminal 30.

It is possible that the heater plate 20 may deteriorate and break, thus requiring replacement. In this case, the joint members 70 and 71 are disengaged from the terminals 25 and 30 (or terminals 45 and 46), and the sensing portion 37 of the thermocouple 36 are removed from the hole 35, whereupon the heater plate 20 can be separated from the support structure 21. Then, a new heater plate 20 is coupled to the structure 21 by means of the joint members 70 and 71. Further, the sensing portion 37 of the electrode terminal 36 is inserted into the hole 35. Changes of the specifications and processing temperature of the to-be-heated object (e.g., wafer W) can be coped with by replacing the heater plate 20 only.

FIGS. 6 and 7 show a joint member 70A according to a second embodiment of the present invention. The joint member 70A is formed of a closely-wound coil spring. The inside coil diameter of the joint member 70A in a free state (not subjected to force) is smaller than the outside diameter of mating terminals 25 and 45 (or terminals 30 and 46). By fitting the joint member 70A on the terminals 25 and 45 (or terminals 30 and 46), the terminals can be coupled to each other by means of the joint member 70A, and electrical conduction is allowed between them.

Figure 8:
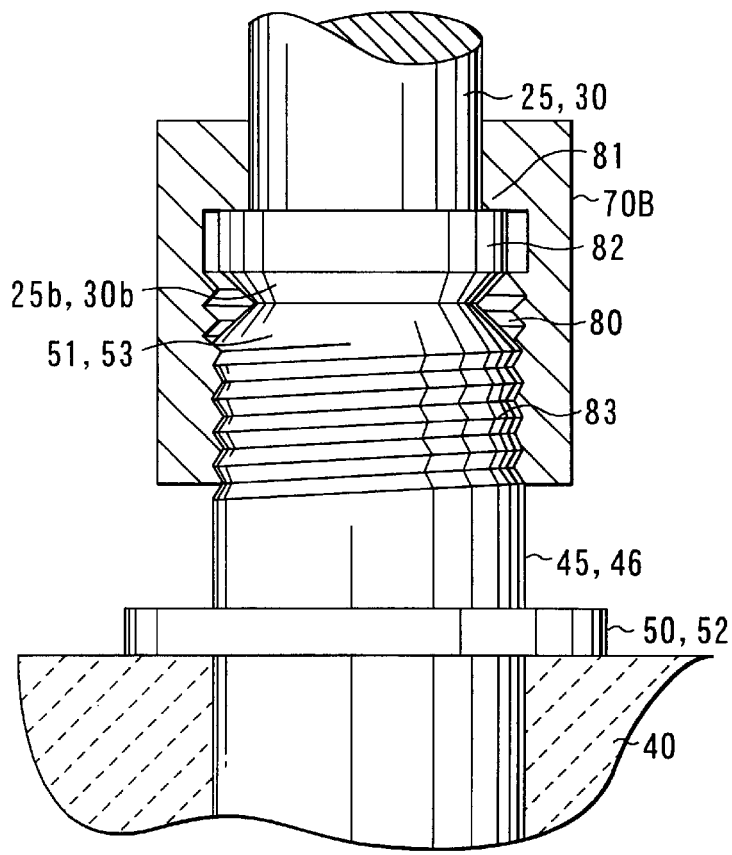
FIG. 8 is a partial sectional view showing a joint member and terminals according to a third embodiment of the invention.

FIG. 8 shows a joint member 70B according to a third embodiment of the invention. The joint member 70B is formed of a hollow cylindrical metallic component that has an internal thread portion 80 and a collar portion 81 on its inner peripheral surface. A terminal 25 (or terminal 30) that mates with the joint member 70B is formed having a flange portion 82, which has an outside diameter greater than the inside diameter of the collar portion 81. An external thread portion 83 is formed on the other terminal 45 (or terminal 46). If the internal thread portion 80 of the joint member 70B is screwed on the external thread portion 83 and tightened, the terminals 25 and 45 (or terminals 30 and 46) can be removably coupled to each other, and electrical conduction is allowed between them. The terminals 25 and 45 (or terminals 30 and 46) can be separated from each other by reversely rotating the joint member 70B and disengaging it from the internal thread portion 83.

Figure 9:
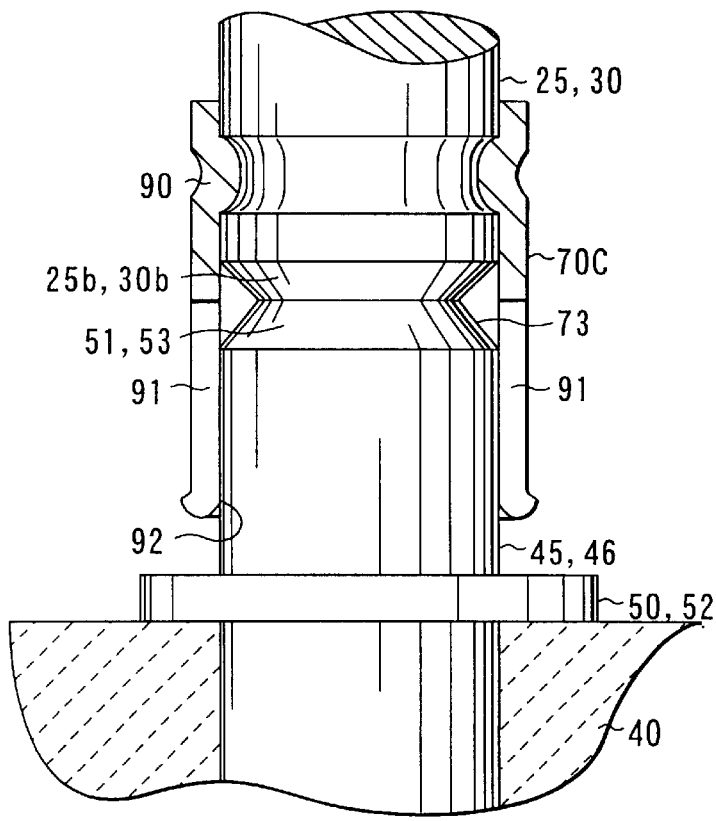
FIG. 9 is a partial sectional view showing a joint member and terminals according to a fourth embodiment of the invention.

FIG. 9 shows a joint member 70C according to a fourth embodiment of the invention. The joint member 70C is formed of a cylindrical metallic spring. A caulked portion 90 that is formed on one end of the joint member 70C is fixed to a terminal 25 (or terminal 30). Axial slits 91 are formed on the other end of the joint member 70C. If a terminal 45 (or terminal 46) is inserted into an opening portion 92 of the joint member 70C, the terminals 25 and 45 (or terminals 30 and 46) can be removably coupled to each other, and electrical conduction is allowed between them. The terminals 25 and 45 (or terminals 30 and 46) can be separated from each other by drawing out the terminal 45 (or terminal 46) from the joint member 70C. In contrast with the case of the embodiment shown in FIG. 8, moreover, the joint member 70C may be fixed to the second terminal 45 (or terminal 46) so that the first terminal 25 (or terminal 30) can be inserted into the member 70C. Common reference numerals are used to designate common portions in the above description of the first embodiment (shown in FIGS. 1 to 5) to fourth embodiment, and a description of those portions is not repeated.

It is to be understood, in carrying out the present invention, that the components that constitute the invention, including the joint members, chamber, heater plate, support structure, first and second terminals, etc., may be variously changed or modified without departing from the scope or spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heating apparatus comprising:
   a heater plate having a surface for supporting a to-be-heated object and including a resistance heating element;
   first terminals protruding on a reverse side of the heater plate and connected electrically to the resistance heating element;
   a support structure for supporting the heater plate in a given position in a chamber;
   second terminals attached to the support structure, individually corresponding in position to the first terminals, and connected to an electric power supply for supplying electric power to the resistance heating element; and
   a joint member of an electrically-conductive material fitted on the first and second terminals, thereby connecting the first and second terminals electrically and mechanically to one another, and removably attached to at least one of the terminals.

2. A heating apparatus according to claim 1, wherein said support structure includes a top plate formed of an electrically-insulating, heat-resistant material and having a diameter smaller than that of the heater plate and a stem provided on the reverse side of the top plate, said second terminals protrude from an end face of the top plate toward the heater plate, and a space is defined between the heater plate and the top plate.

3. A heating apparatus according to claim 1, wherein said joint member is formed of a springy material and is removably fitted on the first or second terminals by utilizing the springiness thereof.

4. A heating apparatus according to claim 2, wherein said joint member is formed of a springy material and is removably fitted on the first or second terminals by utilizing the springiness thereof.

5. A heating apparatus according to claim 3, wherein said joint member is a hollow cylindrical spring having a slit, the inside diameter of the cylindrical spring being smaller than the outside diameter of the first or second terminals so that the first or second terminals can be inserted into the cylindrical spring.

6. A heating apparatus according to claim 3, wherein said joint member is a coil spring, the inside diameter of the coil spring being smaller than the outside diameter of the first or second terminals so that the first or second terminals can be inserted into the coil spring.

7. A heating apparatus according to claim 2, wherein said top plate has at least three terminals including the second terminals, arranged at distance in a circumferential direction of the top plate, the terminals supporting the heater plate on the top plate.

* * * * *